US011262776B2

(12) United States Patent
Berge et al.

(10) Patent No.: US 11,262,776 B2
(45) Date of Patent: Mar. 1, 2022

(54) MODIFYING REGULATOR OUTPUT VOLTAGE WITH A PELTIER DEVICE

(71) Applicant: International Business Machines Corporation, Armonk, NY (US)

(72) Inventors: Layne A. Berge, Rochester, MN (US); John R. Dangler, Rochester, MN (US); Jason J. Bjorgaard, Rochester, MN (US); Kyle Schoneck, Rochester, MN (US); Matthew Doyle, Chatfield, MN (US); Thomas W. Liang, Rochester, MN (US); Matthew A. Walther, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 16/454,264

(22) Filed: Jun. 27, 2019

(65) Prior Publication Data
US 2020/0409401 A1  Dec. 31, 2020

(51) Int. Cl.
*G05F 1/575* (2006.01)
*H01L 25/18* (2006.01)
*H01L 23/38* (2006.01)

(52) U.S. Cl.
CPC .............. *G05F 1/575* (2013.01); *H01L 23/38* (2013.01); *H01L 25/18* (2013.01)

(58) Field of Classification Search
CPC ......... H01L 25/00; H01L 25/18; H01L 23/00; H01L 23/34; H01L 23/36; H01L 23/38;
(Continued)

(56) References Cited

U.S. PATENT DOCUMENTS 4,594,541 A  6/1986 Schott
4,812,733 A  3/1989 Tobey
(Continued)

OTHER PUBLICATIONS

Mihalache et al., "Automated Cooling Control System through Peltier Effect and High Efficiency Control using a DC-DC Buck Converter," 2015 International Semiconductor Conference (CAS), Oct. 2015, pp. 281-284, IEEE. 10.1109/SMICND.2015.7355233.
(Continued)

*Primary Examiner* — Thienvu V Tran
*Assistant Examiner* — Carlos O Rivera-Perez
(74) *Attorney, Agent, or Firm* — Donald J. O'Brien (57) ABSTRACT

A system can control, with a positive temperature-voltage correlation, an output of a voltage regulator with a Peltier device. The Peltier device can receive heat from a heat-producing electronic device, and can have a positive terminal and a negative terminal. A voltage regulator circuit can include a driver device electrically coupled to an input voltage and an output terminal electrically coupled to one of the Peltier device terminals. The voltage regulator circuit can also include a differential amplifier electrically coupled to a reference voltage, an input electrically coupled to another Peltier device terminal and an output electrically coupled to the driver device. The differential amplifier can, in response to a voltage produced by the Peltier device, modulate, with a positive temperature-voltage correlation, an output voltage on the output terminal of the driver device.

20 Claims, 4 Drawing Sheets

(58) Field of Classification Search
CPC ..... H01L 23/40; H01L 23/4012; H01L 35/00;
H01L 35/02; H01L 35/04; H01L 35/28;
H01L 35/30; H01L 35/32; H01L 25/0655;
H01L 24/16; H01L 2224/16227; H01L
2224/73253; H01L 2924/15192; H05K
7/20; H05K 7/20709; H05K 7/20836;
H05K 7/20945; G05F 1/10; G05F 1/46;
G05F 1/462; G05F 1/463; G05F 1/56;
G05F 1/561; G05F 1/565; G05F 1/575;
G05F 1/585; G05F 1/59; G05F 1/595;
F25B 21/00; F25B 21/02; F25B 21/04
USPC ................ 323/222–226, 266, 268–275, 280,
323/282–286, 304, 311–317, 351, 907;
363/141, 144, 146, 147; 361/688, 696,
361/697, 701–704, 709–713; 62/3.1–3.7
See application file for complete search history.

(56) References Cited

U.S. PATENT DOCUMENTS

| | | | |
|---|---|---|---|
| 4,935,864 A | 6/1990 | Schmidt et al. | |
| 5,124,566 A | 6/1992 | Hu | |
| 6,253,556 B1 | 7/2001 | Schendel | |
| 6,748,747 B2 | 6/2004 | Hoschek | |
| 7,971,440 B2* | 7/2011 | Chan | H01L 35/30 |
| | | | 62/3.7 |
| 9,537,391 B2 | 1/2017 | Fajtl | |
| 2012/0151940 A1* | 6/2012 | Uratani | G05D 23/1919 |
| | | | 62/3.7 |

OTHER PUBLICATIONS

Alaoui, C., "Peltier Thermoelectric Modules Modeling and Evaluation," International Journal of Engineering (IJE), vol. 5, Issue 1, 2011, pp. 114-121. http://citeseerx.ist.psu.edu/viewdoc/download?doi=10.1.1.741.5453&rep=rep1&type=pdf.

"Thermoelectric cooling," Wikipedia, printed: 7 Mary 2019, 6 pages. https://en.wikipedia.org/wiki/Thermoelectric_cooling.

Error Amplifier image, Wikipedia, printed: May 7, 2019, 1 page. https://upload.wikimedia.org/wikipedia/commons/e/ef/Error-amplifier.svg.

* cited by examiner

MODIFYING REGULATOR OUTPUT VOLTAGE WITH A PELTIER DEVICE

BACKGROUND

The present disclosure generally relates to modulating the output of a voltage regulator within an electronic system. In particular, this disclosure relates to using a temperature-dependent output of a Peltier device to modulate the control input of a voltage regulator.

A Peltier device is a solid-state active heat pump that can function as a either a thermoelectric cooler or heater. A Peltier device functions by transferring heat from one surface of the device to an opposing surface. The heat transfer is accomplished by providing a voltage across a series of electrically interconnected N-type and P-type semiconductor elements within the Peltier device. An applied voltage of one polarity causes heat to be transferred in one direction across the Peltier device, while an applied voltage of the opposite polarity causes heat to be transferred in the opposite direction. Accordingly, in some applications, a Peltier device can also be used as a temperature controller that can provide either heating or cooling.

A Peltier device can also be referred to as a "Peltier heat pump," a "solid state refrigerator," or a "thermoelectric cooler" (TEC). Advantages of a Peltier device compared to vapor-compression refrigerator include its lack of moving parts or circulating liquid, very long life, invulnerability to leaks, relatively small size, and flexible shape.

A Peltier device can also be used as a thermoelectric generator. In such applications, one side of the Peltier device is heated to a temperature greater than the other side, and as a result, a voltage difference builds up between the two sides. This conversion of heat directly into a voltage difference at the junction(s) of different types of conductive materials, e.g., wires and/or semiconductors, is known as the "Seebeck effect." This generated voltage difference is proportional to the temperature difference between the two sides, and can be useful as a monitoring or control signal that represents the temperature difference. For ordinary materials at room temperature, Seebeck coefficients can range in value, for example, from $-100$ $\mu V/^\circ$ K to $+1000$ $\mu V/^\circ$ K.

SUMMARY

Embodiments can be directed towards a system for controlling, with a positive temperature-voltage correlation, an output of a voltage regulator with a Peltier device. The system can include a heat-producing electronic device and the Peltier device. The Peltier device can include a first surface arranged in thermally conductive contact with a surface of the heat-producing electronic device and a second surface opposing the first surface. The Peltier device can also include a set of semiconductor elements each in thermally conductive contact with the first surface and with the second surface. At least two of the semiconductor elements are electrically coupled in series with set of terminals. The set of terminals can include a positive terminal and a negative terminal. The system can also include a voltage regulator circuit. The voltage regulator circuit can include a driver device having an input terminal electrically coupled to an input voltage and an output terminal electrically coupled to a first terminal of the set of terminals. The voltage regulator circuit can also include a differential amplifier having a non-inverting input electrically coupled to a reference voltage, an inverting input electrically coupled to a second terminal of the set of terminals and an output electrically coupled to a control input terminal of the driver device. The differential amplifier can be configured to, in response to a voltage produced by the Peltier device, modulate, with a positive temperature-voltage correlation, by varying a voltage on the control input terminal of the driver device, an output voltage on the output terminal of the driver device.

Embodiments can be directed towards a system for controlling, with a negative temperature-voltage correlation, an output of a voltage regulator with a Peltier device. The system can include a heat-producing electronic device and the Peltier device. The Peltier device can include a first surface arranged in thermally conductive contact with a surface of the heat-producing electronic device and a second surface opposing the first surface. The Peltier device can also include a set of semiconductor elements each in thermally conductive contact with the first surface and with the second surface. At least two of the semiconductor elements can be electrically coupled in series with set of terminals. The set of terminals can include a positive terminal and a negative terminal. The system can also include a voltage regulator circuit. The voltage regulator circuit can include a driver device having an input terminal electrically coupled to an input voltage and an output terminal electrically coupled to a first terminal of the set of terminals. The voltage regulator circuit can also include a differential amplifier having an inverting input electrically coupled to a reference voltage, a non-inverting input electrically coupled to a second terminal of the set of terminals and an output electrically coupled to a control input terminal of the driver device. The differential amplifier can be configured to, in response to a voltage produced by the Peltier device, modulate, with a negative temperature-voltage correlation, by varying a voltage on the control input terminal of the driver device, an output voltage on the output terminal of the driver device.

Embodiments can also be directed towards a method for modifying a voltage regulator output voltage solely in response to a changed amount of heat received by a Peltier device. The method can include receiving, with a Peltier device, the changed amount of heat from a thermal source and modifying, in response to the changed amount of heat, an output voltage of the Peltier device. The method can include receiving, with a voltage regulator differential amplifier electrically coupled to the Peltier device, the output voltage of the Peltier device and modulating, with the output voltage of a voltage regulator differential amplifier electrically coupled to a driver device, a driver device input voltage. The method can include modulating, with the driver device, in response to the driver device input voltage, an output voltage of the driver device.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing rapid, dynamic and efficient adjustment of voltage regulator output voltages for electronic equipment such as servers, which may be used to provide data to clients attached to a server through a network. Such servers may include, but are not limited to, web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing rapid, dynamic and efficient adjustment of voltage regulator output voltages for electronic equipment such as computing systems, which may be used in a wide variety of computational and data processing applications. Such computing systems may include, but are not limited to, supercomputers, high-performance computing (HPC) systems, and other types of special-purpose computers. Embodiments may also be directed towards providing rapid, dynamic and efficient adjustment of voltage regulator output voltages for electronic equipment such as personal computers, small office/home office (SOHO) equipment, and personal electronic devices.

The term "positive temperature-voltage correlation" can be understood to refer to a causal correlation between a temperature differential and a resulting voltage. In the context of the present disclosure, a positive temperature-voltage correlation refers the relationship between a temperature differential applied to opposing surfaces of a Peltier device and a resulting voltage produced at the output of an electrically interconnected voltage regulator. The term "positive" is used in reference to an increase in temperature differential producing an increase in the voltage regulator output voltage. Similarly, the term "negative temperature-voltage correlation" is used herein to refer to a causal relationship between a temperature differential and a resulting voltage where an increase in the applied temperature differential produces a decrease in the voltage regulator output voltage.

The terms "bring-up environment" and "debug environment" can be used interchangeably herein, and can refer to a configuration or state of an electronic system, e.g., computer system, in which the system can be readily tested. Such testing can include the application of relatively low-level software instructions, possibly in conjunction with applying and observing electrical signals through external sources, e.g., signal generators and oscilloscopes. An electronic system in a bring-up/debug environment can be partially disassembled, in order to facilitate application and observing electrical signals, and may be limited to function at a relatively low level. A system in a "bring-up," or "debug" environment may have limited ability to run high-level software such as advanced operating system or application code.

A "production environment" as discussed hereinafter, in contrast to a "bring-up environment" or "debug environment" can be understood to include an electronic system that is fully assembled and fully functional at a high level that is useful to system end-users. A system in a production environment may be understood to have operational capabilities that are not limited by physical disassembly or limited software.

The terms "set point" and "regulator set point" can be used interchangeably herein in reference to a voltage level input to a voltage regulator that determines the output voltage of the voltage regulator. A set point may change in response to various factors such as a current load placed upon the voltage regulator or demand for increased system performance or decreased power consumption.

In both bring-up and production environments, the output voltages of voltage regulators that provide power to various types/groups of electronic components within an electronic system may have occasion to be adjusted. For example, a particular supply voltage may be decreased in order to reduce power consumption and prevent the electronic system from overheating and subsequently failing. Another example can include increasing a supply voltage in order to compensate for decreased system performance at high operating temperatures.

Such power-supply voltage adjustments may be performed frequently and/or dynamically, and may conventionally require hardware rework e.g., replacing certain components, or modification to firmware. Performing such modifications may be cumbersome due a combination of the resulting time, effort or disassembly/modification of the electronic system required. Embodiments of the present disclosure can provide for simplified, rapid, automated and dynamic adjustment of power supply output voltages without need for manual intervention, disassembly, rework, or firmware updates. Such power supply output voltage adjustments can be useful for substantially enhancing electronic system performance within a "fail-safe" operating environment.

The figures herein depict a relatively simple implementation of a Peltier device in conjunction with a single voltage regulator, which can be used for adjusting the voltage regulator output voltage in response to the operating temperature of a heat-producing electronic device. It can be understood, however, that, within the spirit and scope of the present disclosure, embodiments can be significantly more complex than those illustrated and described herein. For example, a number of Peltier devices can be used in tandem to monitor, individually or collectively, the operating temperatures of a number of electronic devices, and voltages received from these multiple Peltier devices can be used to adjust one or more voltage regulator output voltages.

In embodiments, within a bring-up environment, a Peltier device can be used to modify a voltage regulator set point e.g., $V_{REF}$, which can, in turn, alter the voltage output, e.g., $V_{OUT}$, of the voltage regulator. The voltage output of the voltage regulator can thereby be changed without having to perform hardware modifications or rework and/or change software or firmware. This capability can be particularly useful in accelerating a bring-up process for a computer or other type of electronic system.

According to embodiments, a Peltier device can be used to modify a voltage regulator output voltage without the need to change resistor values, i.e., non-invasively, through the use of an environment chamber which can change the temperature differential across the Peltier device. Alternately, the temperature differential across the Peltier device can be altered through the use of externally supplied thermal agents such as "freeze spray," extra cooling air circulation, an infrared heat source or a heat gun.

In a production environment, according to embodiments, the voltage regulator output voltage can be affected by the Peltier device in order to either reduce or increase a system clock frequency. In some embodiments, a Peltier device can also be used to raise a voltage regulator output voltage in order to compensate for system performance degradation resulting from high device operating temperatures.

Embodiments can be useful in enabling optimal/managed system operating speed at a particular operating temperature. For example, some embodiments can allow $V_{OUT}$ to be maintained at an enhanced, i.e., tighter, tolerance, while using lower-cost lower tolerance passive components.

According to embodiments, Peltier devices can be used to lower a voltage regulator output voltage to promote system temperature reduction, i.e., provide a system "fail-safe" mode. In such embodiments, if a cooling system, e.g., fan, water chiller, etc., fails, embodiments could, in response, reduce the processor voltage set point, creating an "undervoltage" condition, which could subsequently result in shutdown down of the system and the preservation of both system hardware and data.

Some embodiments of the present disclosure can be useful in changing voltage regulator voltage set points in the field, based upon new information not available at product release, i.e., information pertaining to field issues, operation corrections and/or debug. Accordingly, in-field voltage regulator adjustments can be made that are based on this new information learned after product release.

Some embodiments can be used in monitoring and/or providing feedback regarding device operating temperatures to a system supervisory processor, also referred to as a "service processor." Such a service processor can be configured to subsequently adjust the set point of a particular voltage regulator accordingly, and/or report the device operating temperature to a user or administrator through a system alert or message. Such alerts and messages can include a message sent to a user console or device, an email, text or Short Messaging Service (SMS) message, voice message, or the like.

Embodiments of the present disclosure can be useful in implementing cost-effective voltage regulator voltage adjustment apparatuses for use with heat producing electronic devices, by using existing and proven Peltier device, voltage regulator and integrated circuit (IC) technologies. Embodiments of the present disclosure can be compatible for use within existing electronic system, e.g., computer and server, applications.

Figure 1:
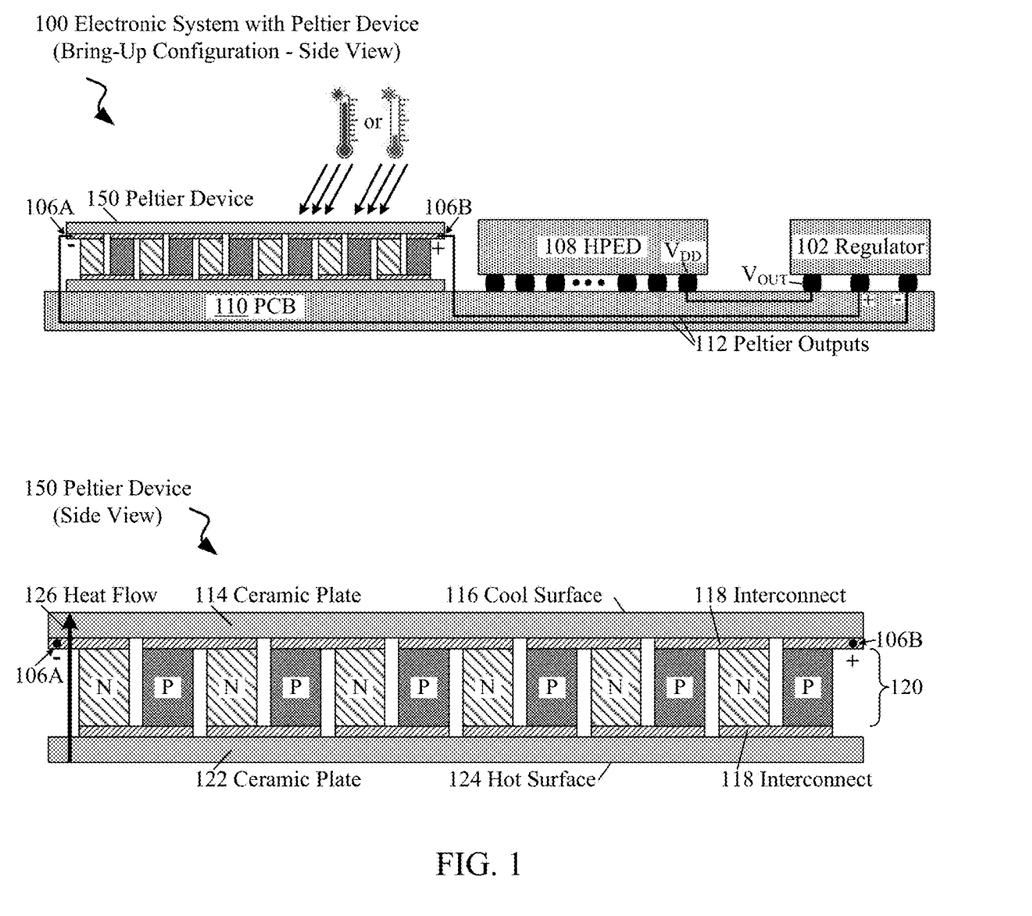
FIG. 1 includes a side view depiction of an electronic system with a Peltier device and a side view depiction of a Peltier device, according to embodiments of the present disclosure.

Certain embodiments relate to modulating the output of a voltage regulator within an electronic system. FIG. 1 includes a side view depiction 100 of an electronic system including a Peltier device in a "bring-up" configuration or environment, and a side view depiction 150 of a Peltier device, according to embodiments of the present disclosure. According to embodiments, the electronic system depicted in view 100 can be useful for controlling, with either a positive or a negative temperature-voltage correlation, an output of voltage regulator 102 with Peltier device 150.

Electronic system with Peltier device (side view) 100 depicts an electronic system that includes a heat-producing electronic device 108 and a voltage regulator 102 both physically mounted on and electrically interconnected by printed circuit board (PCB) 110. In some embodiments, heat-producing electronic device 108 can be a processor IC, an analog IC, a mixed-signal IC or other type of IC containing digital logic circuits, such as an application-specific integrated circuit (ASIC), programmable logic device (PLD), or Field Programmable Gate Array (FPGA).

Voltage regulator 102 is electrically coupled to Peltier device 150 through Peltier outputs 112, which include both a positive (+) wire connected to Peltier device terminal 106B and a negative (−) wire connected to Peltier device terminal 106A. According to embodiments, voltage regulator 102 output $V_{OUT}$ is electrically coupled to a $V_{DD}$ supply input of heat-producing electronic device 108. According to embodiments, voltage regulator 102 receives a temperature-differential dependent voltage from Peltier device 150, through Peltier outputs 112, and can, accordingly, adjust the voltage present on the $V_{DD}$ supply input of heat-producing electronic device 108. The above-described physical and electrical arrangement constitutes a control system that can be used to dynamically and automatically adjust the $V_{DD}$ supply input voltage of heat-producing electronic device 108.

Such an electronic system can be effectively used within a bring-up or debug environment. In such a bring-up environment, a Peltier device 150 can be used to modify a set point $V_{REF}$ of a voltage regulator 102, which in turn can alter the output voltage $V_{OUT}$ of voltage regulator 102. The voltage output of the voltage regulator can thereby be changed without having to perform invasive hardware modifications or rework, e.g., changing resistor values, and/or changing software or firmware. This capability can be particularly useful in accelerating a bring-up process for a computer or other type of electronic system.

Externally supplied thermal agents may be directly applied to the cool surface 116 of Peltier device 150. In some embodiments, such agents may be directly applied to an attached heat sink 204, FIG. 2. By way of example, a temperature differential across the Peltier device surfaces, i.e., hot surface 124 and cool surface 116, view 200, can be altered through the use of such externally supplied thermal agents such as "freeze spray," enhanced cooling air circulation, an infrared heat source or a heat gun. In some embodiments, placing a portion of the electronic system that includes the Peltier device 150 into an environment chamber can also be useful in changing the temperature differential across the Peltier device 150.

View 150 is a side-view depiction of a Peltier device that includes ceramic plates 114 and 122 that are both in thermally conductive contact with a set of P-type and N-type semiconductor elements 120. Ceramic plate 114 includes cool surface 116 and ceramic plate 122 includes hot surface 124. The P-type and N-type semiconductor elements 120 are each electrically connected to interconnect 118 to form a series electrical circuit between negative terminal 106A and positive terminal 106B. Interconnect 118 can include various electrically conductive materials such as copper, copper alloys, aluminum, tin and lead.

It can be understood that, in accordance with the Seebeck effect, a temperature difference between the hot surface 124 and the cool surface 116 can produce a voltage difference between the corresponding opposite surfaces of each of the P-type and N-type semiconductor elements 120. Peltier devices can be fabricated so that the P-type and N-type semiconductor elements 120 are each electrically connected by interconnect 118, in order to form a series electrical circuit between two terminals, negative terminal 106A and positive terminal 106B. Thus, a temperature differential present between the opposing Peltier device surfaces, i.e., hot surface 124 and cool surface 116, produces a voltage proportional to the temperature differential between terminals 106A and 106B.

Figure 2:
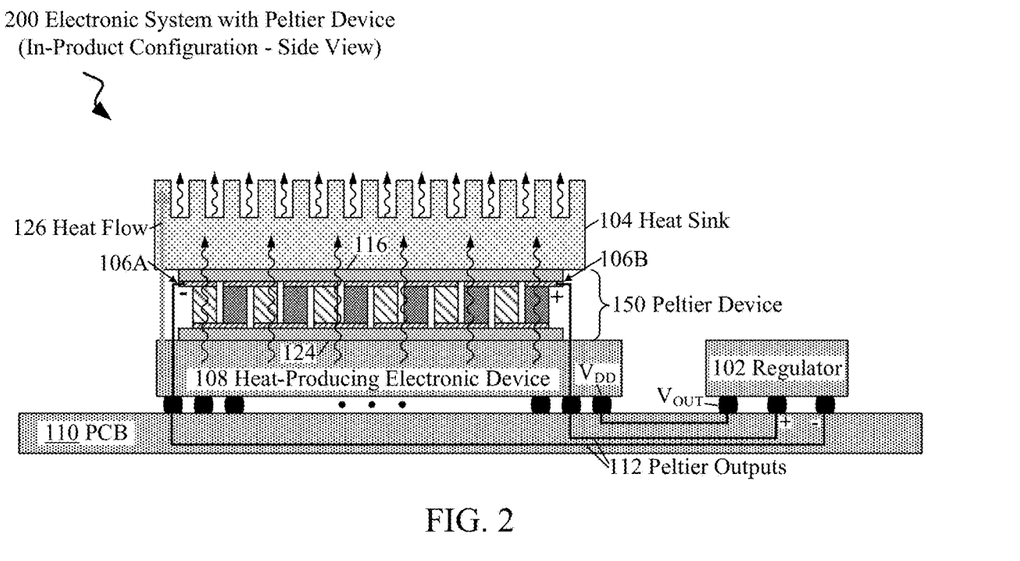
FIG. 2 includes a side view depiction of an electronic system with a Peltier device, according to embodiments consistent with the figures.

FIG. 2 includes a side view depiction 200 of an electronic system including a Peltier device in an "in-product" configuration or environment, according to embodiments of the present disclosure. According to embodiments, the electronic system depicted in view 200 can be useful for controlling, with either a positive or a negative temperature-voltage correlation, an output of voltage regulator 102 with Peltier device 150. View 200 depicts an electronic system generally consistent with view 100.

Electronic system with Peltier device 200 depicts an electronic system that includes a heat-producing electronic device 108 and a voltage regulator 102 both physically mounted on and electrically interconnected by PCB 110. This physical and electrical arrangement constitutes a closed-loop feedback system between heat-producing electronic device 108, Peltier device 150 and voltage regulator 102. This control system can be used to monitor the operating temperature of heat-producing electronic device 108 and adjust its $V_{DD}$ supply input voltage accordingly.

View 200 can be useful in representing a generic arrangement of components commonly included in various electronic systems such as computers and servers. View 200 can also be useful in representing such components in a representative production environment or configuration, i.e., in a fully assembled and functional state.

In a production environment the voltage regulator output voltage $V_{OUT}$ can be affected, for example, by the Peltier device 150, in order to either reduce or increase a system clock frequency. According to embodiments, a Peltier device 150 can also be used to raise $V_{OUT}$ in order to compensate for system performance degradation resulting from high device operating temperatures. Peltier devices can also be used to lower a voltage regulator output voltage to promote system temperature reduction, i.e., provide a system "failsafe" mode.

Electronic system 200 includes a Peltier device 150 mounted onto and in thermally conductive contact with heat-producing electronic device 108. Peltier device 150 includes hot surface 124 arranged in thermally conductive contact with a surface of heat-producing electronic device 108 and cool surface 116 opposite to hot surface 124. Peltier device 150 can be understood to generate a voltage across terminals 106A and 106B, in accordance with the Seebeck effect, in response to a temperature differential present between hot surface 124 and cool surface 116. Such a temperature differential can be caused by heat dissipated from heat-producing electronic device 108 flowing in the direction indicated by heat flow 126.

Electronic system 200 also includes a heat sink 204 in thermally conductive contact with the cool surface 116 of the Peltier device 150. Heat sink 204 can be used to dissipate heat generated by heat-producing electronic device 108 as well as to enhance a temperature difference, i.e., thermal gradient, between hot surface 124 and cool surface 116 of Peltier device 150.

Figure 3:
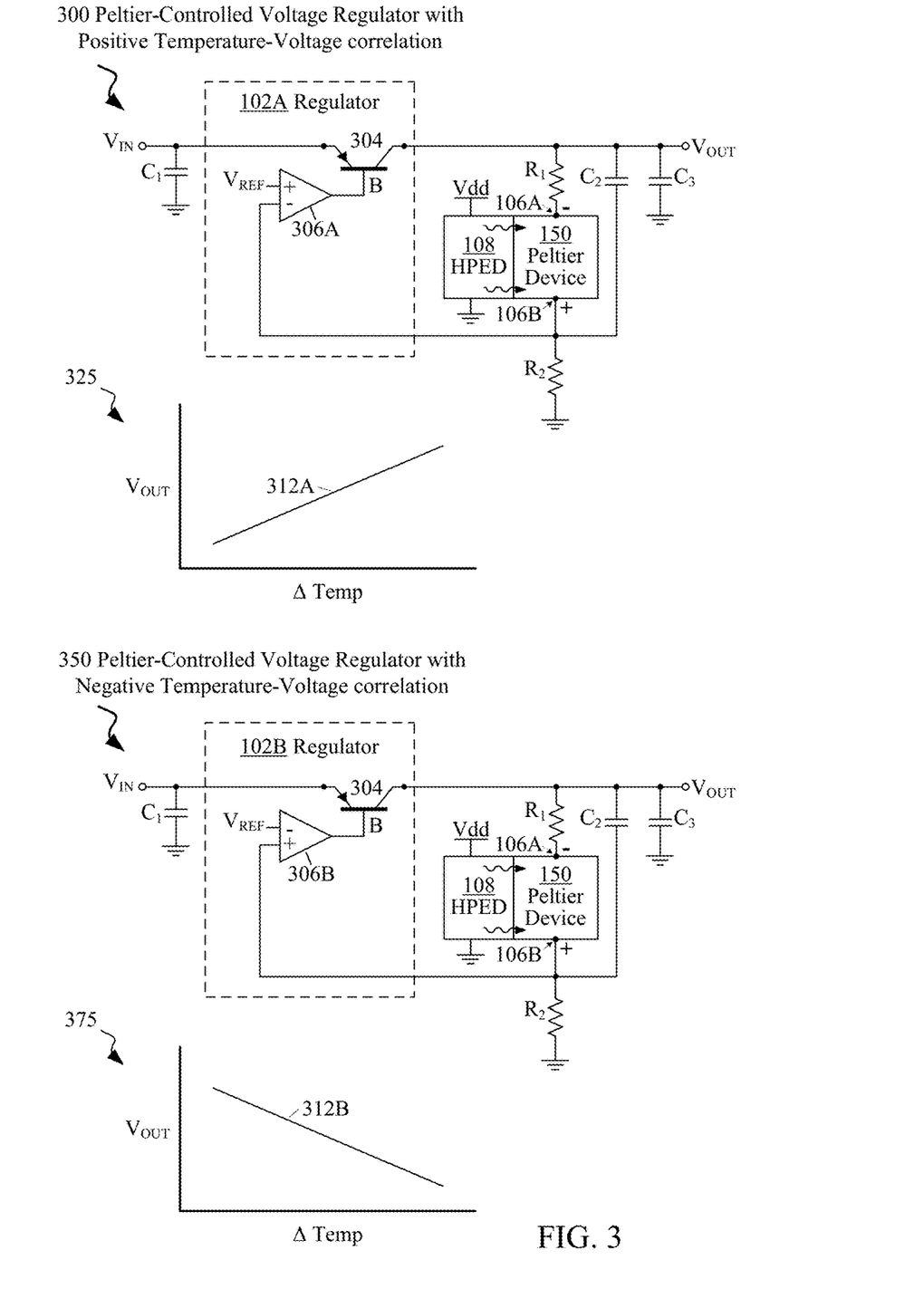
FIG. 3 includes depictions of a Peltier-controlled voltage regulator with positive temperature-voltage correlation, a Peltier-controlled voltage regulator with negative temperature-voltage correlation, and corresponding output voltage vs. temperature graphs, according to embodiments consistent with the figures.

FIG. 3 includes a view 300 of a Peltier-controlled voltage regulator with positive temperature-voltage correlation, a view 350 of a Peltier-controlled voltage regulator with negative temperature-voltage correlation, and corresponding voltage regulator output voltage ($V_{OUT}$) vs. Δ temperature graphs 325 and 375, respectively, according to embodiments consistent with the figures. Views 300 and 350 can be useful in providing, in conjunction with FIG. 2, a detailed understanding of how a voltage produced by a Peltier device 150 can be used to modulate the $V_{OUT}$ output of a voltage regulator, e.g., 102A and 102B, respectively.

View 300 includes heat-producing electronic device 108 and Peltier device 150, both physically and electrically consistent with FIG. 2, arranged in thermally conductive contact with each other. View 300 also includes a voltage regulator 102A circuit that includes driver device 304 and differential amplifier 306A.

Driver device 304 includes an input terminal electrically coupled to an input $V_{IN}$ and an output terminal electrically coupled to an output voltage terminal $V_{OUT}$. In some embodiments, the driver device 304 can include an NPN transistor, a PNP transistor, an N-channel field-effect transistor (NFET), or a P-channel field-effect transistor (PFET). In some embodiments, driver device 304 can also include various other types of semiconductor devices capable of modulating voltage regulator output voltages.

Differential amplifier 306A includes a non-inverting input (+) electrically coupled to a reference voltage input $V_{REF}$, an inverting input (−) electrically coupled to positive Peltier device terminal 106B and an output electrically coupled to a control input terminal (B) of driver device 304. The differential amplifier 306A is configured to, in response to a voltage produced by the Peltier device 150, modulate, with a positive temperature-voltage correlation, an output voltage $V_{OUT}$ on the output terminal of the driver device. This modulation is accomplished by differential amplifier 306A varying a voltage on the control input terminal (B) of the driver device 304. In some embodiments, the differential amplifier 306A can be, for example, an operational amplifier.

According to embodiments, an increase in the temperature differential (Δ Temp) between hot surface 124, FIG. 2 and cool surface 116, FIG. 2, of Peltier device 150, results in a voltage increase at Peltier device terminal 106B relative to Peltier device terminal 106A. This increase in voltage is received by the inverting (−) terminal of differential amplifier 306A, causing the output of differential amplifier 306A to be driven to a lower voltage. Electrically connected control input terminal (B) of driver device 304, depicted as a PNP transistor, correspondingly is drawn to a lower voltage, causing an increase in current and voltage at the voltage output $V_{OUT}$ node. This increase in output voltage in response to an increase in Peltier device temperature differential can be understood to be a positive temperature correlation. This positive temperature correlation is depicted in graph 325.

In some embodiments, the output voltage on the output terminal $V_{OUT}$ of the driver device 304 can be electrically coupled to a supply voltage input $V_{DD}$ of the heat-producing electronic device 108. In some embodiments, the output voltage on the output terminal $V_{OUT}$ of the driver device 304 can be electrically coupled to a particular supply voltage domain of the heat-producing electronic device 108. Supply voltage domains can include but are not limited to a clock voltage domain, an input/output (I/O) voltage domain, an analog voltage domain and a digital logic voltage domain.

In some embodiments, a Peltier-controlled voltage regulator, e.g., 300, can also include at least one capacitor electrically coupled to the voltage input $V_{IN}$ and/or the voltage output $V_{OUT}$ of the voltage regulator 300. For example, capacitor C1 can be electrically connected between $V_{IN}$ and ground, capacitor C2 can be electrically connected between $V_{OUT}$ and Peltier device terminal 106B, and capacitor C3 can be electrically connected between $V_{OUT}$ and ground. Capacitors such as C1, C2, and C3 can be useful for providing filtering/decoupling to the $V_{IN}$, $V_{OUT}$ and Peltier device terminal 106B nodes, respectively.

In some embodiments, a Peltier-controlled voltage regulator, e.g., 300, can also include at least one resistor electrically coupled to the Peltier device terminals 106A and/or 106B. Resistors such as R1 and R2 can be useful for providing a bias voltage for the Peltier device terminals 106A and/or 106B.

Graph 325 can be useful in depicting a positive temperature-voltage correlation, i.e., a correlation between a temp differential (Δ Temp) between a hot surface 124 and cool surface 116 of a Peltier device, as discussed above, and a voltage regulator output voltage, e.g., $V_{OUT}$, view 300. Accordingly, a positive temperature-voltage correlation corresponds to a positive increase in $V_{OUT}$ in response to a positive increase in Δ Temp. For ease of illustration, graph 325 depicts this correlation as curve 312A that is a linear relationship, however, other types of relationships may be possible. In some embodiments, curve 312A may be non-linear.

In embodiments, a Peltier-controlled voltage regulator with positive temperature correlation 300 can be useful in applications where an increased temperature of heat-producing electronic device 108 is to be responded to by increasing a supply voltage, for example, to increase device performance to compensate for high-temperature operating conditions.

Peltier-controlled voltage regulator 350 is generally consistent with Peltier-controlled voltage regulator 300. Voltage regulator 350 includes heat-producing electronic device 108 and Peltier device 150, both physically and electrically consistent with FIG. 2, arranged in thermally conductive contact with each other. View 350 also includes a voltage regulator 102B circuit that includes driver device 304 and differential amplifier 306B.

Differential amplifier 306B includes an inverting input (−) electrically coupled to a reference voltage input $V_{REF}$, a non-inverting input (+) electrically coupled to positive Peltier device terminal 106B and an output electrically coupled to a control input terminal (B) of driver device 304. The differential amplifier 306B is configured to, in response to a voltage produced by the Peltier device 150, modulate, with a negative temperature-voltage correlation, an output voltage on the output terminal of the driver device. This modulation is accomplished by differential amplifier 306B varying a voltage on the control input terminal (B) of the driver device 304. In some embodiments, the differential amplifier 306B can be, for example, an operational amplifier.

According to embodiments, an increase in the temperature differential (Δ Temp) between hot surface 124, FIG. 2 and cool surface 116, FIG. 2, of Peltier device 150, the voltage at Peltier device terminal 106B increases relative to Peltier device terminal 106A. This increase in voltage is received by the non-inverting (+) terminal of differential amplifier 306B, causing the output of differential amplifier 306B to be driven to a higher voltage. Electrically connected control input (B) of driver device 304, depicted as a PNP transistor, correspondingly is drawn to a higher voltage, causing a decrease in current and voltage at the voltage output $V_{OUT}$ node. This decrease in output voltage in response to an increase in Peltier device temperature differential can be understood to be a negative temperature correlation. This negative temperature correlation is depicted in graph 375.

In some embodiments, a Peltier-controlled voltage regulator, e.g., 350, can also include at least one capacitor electrically coupled to the voltage input $V_{IN}$ and/or the voltage output $V_{OUT}$ of the voltage regulator 350. Capacitors such as C1, C2, and C3 can be useful for providing filtering/decoupling to the $V_{IN}$, $V_{OUT}$ and Peltier device terminal 106B nodes.

Graph 375 can be useful in depicting a negative temperature-voltage correlation, i.e., a correlation between a temp differential (Δ Temp) between a hot surface 124 and cool surface 116 of a Peltier device, as discussed above, and a voltage regulator output voltage, e.g., $V_{OUT}$, view 350. Accordingly, a negative temperature-voltage correlation corresponds to a decrease in $V_{OUT}$ in response to a positive increase in Δ Temp. For ease of illustration, graph 375 depicts this correlation as curve 312B that is a linear relationship, however, other types of relationships may be possible. In some embodiments, curve 312B may be non-linear.

In embodiments, a Peltier-controlled voltage regulator with negative temperature correlation 350 can be useful in applications where an increased temperature of heat-producing electronic device 108 is to be responded to by a decreasing a supply voltage, for example, to reduce device power consumption.

Figure 4:
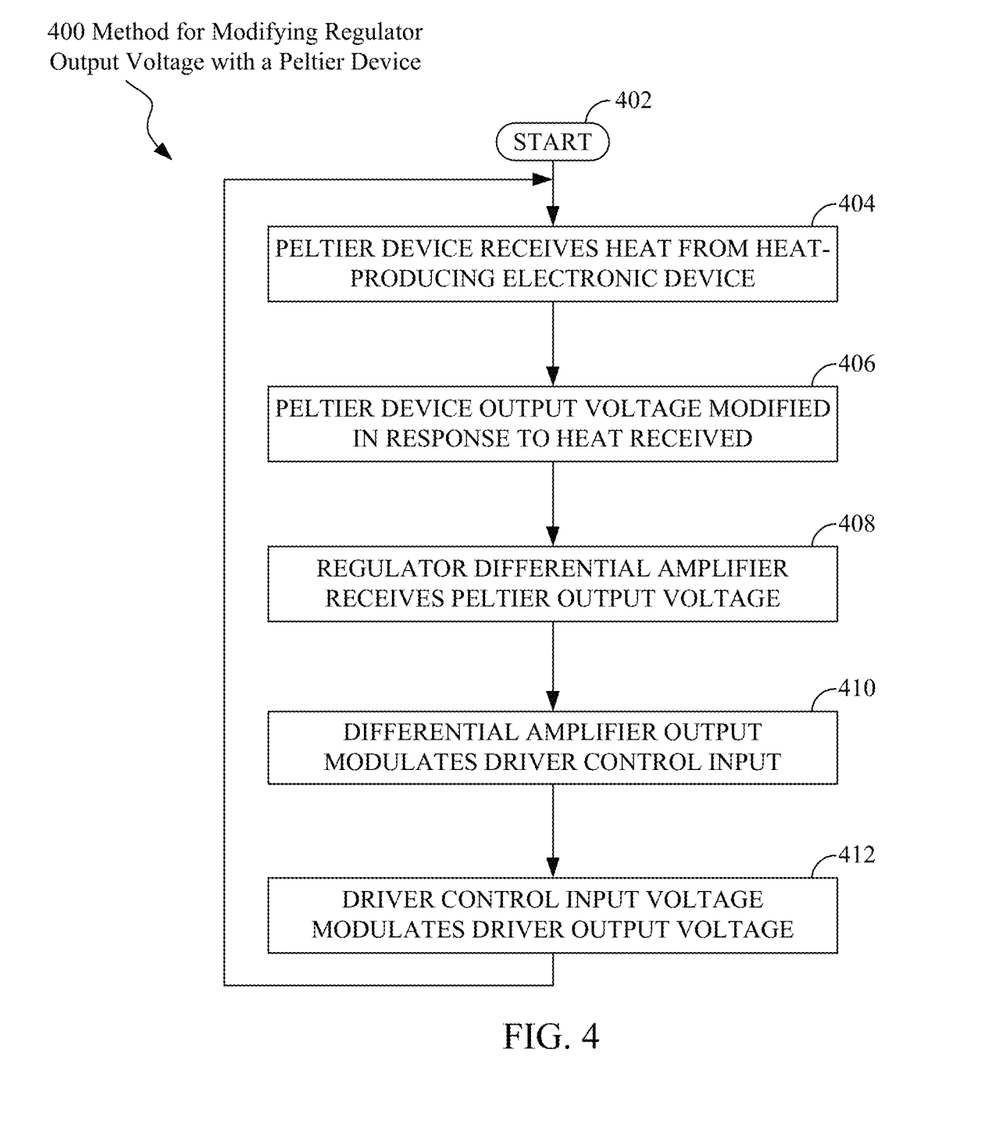
FIG. 4 is a flow diagram depicting a method for modifying a voltage regulator output voltage with a Peltier device, according to embodiments consistent with the figures.

FIG. 4 is a flow diagram 400 depicting a process for modifying a voltage regulator output voltage, e.g., $V_{OUT}$, FIG. 2, with a Peltier device 150, FIG. 2, according to embodiments consistent with the figures.

Certain operations of the process 400 can be performed by Peltier device 150, FIG. 3, in conjunction with a voltage regulator, e.g., 102A or 102B, FIG. 3. The electrical connection between the Peltier device 150 and the voltage regulator 102A or 102B can be useful in allowing them to act together as a closed-loop feedback and control system. The execution of process 400 can provide, through the use of a Peltier-controlled voltage regulator, e.g., 300 or 350, FIG. 3, automated, efficient and precise control of a voltage regulator output voltage in response to a heat-producing electronic device temperature measured with a Peltier device 150, FIG. 3.

The process depicted and described with reference to FIG. 4 is generally consistent with the electronic system with Peltier device 200 and Peltier-controlled voltage regulators 300 and 350 depicted in and described in reference to FIGS. 2-3.

The process 400 moves from start 402 to operation 404. Operation 404 generally refers to the Peltier device, e.g., 150, FIG. 2, receiving heat from a heat-producing electronic device, e.g., 108, FIG. 2. During normal operation electrical power received by heat-producing electronic device 108, FIG. 2 is dissipated as heat. According to embodiments, the thermally conductive contact between a heat-producing electronic device, e.g., 108, FIG. 2, with a Peltier device, e.g., 150, FIG. 2, can provide for heat transfer/flow from heat-producing electronic device 108 to, for example, a heat sink 204, FIG. 2, thru Peltier device 150. Once heat has been received from a heat-producing electronic device, the process 400 moves to operation 406.

Operation 406 generally refers to modifying, in response to heat received from the heat-producing electronic device 108, FIG. 2, an output voltage of the Peltier device, 150, FIG. 2. A set of P-type and N-type semiconductor elements 120, FIG. 2, are electrically connected in series, using interconnect 118, FIG. 2, to create a thermopile structure which responds to a temperature differential across opposite sides of each of the semiconductor elements by generating a voltage between Peltier device terminals 106A and 106B. An increase in heat flow from heat-producing electronic device 108, FIG. 2, creates an increased voltage between terminals 106A and 106B. Similarly, a decrease in heat flow from heat-producing electronic device 108, FIG. 2, results in a decreased voltage between terminals 106A and 106B. Once the output voltage of the Peltier device has been modified, the process 400 moves to operation 408.

Operation 408 generally refers to receiving, with a voltage regulator differential amplifier 306A or 306B, FIG. 3, electrically coupled to the Peltier device 150, FIG. 3, the output voltage of the Peltier device 150. In some embodiments, the output voltage of the Peltier device 150 is received by an inverting (−) terminal of differential amplifier 306A, FIG. 3, in some embodiments, the output voltage of the Peltier device 150 is received by a non-inverting (+) terminal of differential amplifier 306B, FIG. 3. Once the output voltage of the Peltier device is received, the process 400 moves to operation 410.

Operation 410 generally refers to modulating, with an output voltage of the differential amplifier 306, FIG. 3, the control input voltage of the driver device 304, FIG. 3. In some embodiments, e.g., view 300, FIG. 3, the differential amplifier 306A is configured to provide a positive temperature correlation between the Peltier device 150 temperature differential and the regulator output voltage, $V_{OUT}$. In some embodiments, e.g., view 350, FIG. 3, the differential amplifier 306B is configured to provide a negative temperature correlation between the Peltier device 150 temperature differential and the regulator output voltage, $V_{OUT}$. Once the control input voltage of the driver device is modulated, the process 400 moves to operation 412.

Operation 412 generally refers to modulating, with the driver device 304, FIG. 3, in response to the driver device input voltage $V_{IN}$, FIG. 3, an output voltage $V_{OUT}$, FIG. 3, of the driver device 304, FIG. 3. FIG. 3 depicts the driver device 304 as a PNP bipolar transistor, however, a variety of types of transistors, e.g., NPN, NFET, PFET, may be used as driver devices. A circuit designer can select a particular driver device based upon criteria such as gain, on-resistance, maximum current capacity, and the like. Once the output voltage $V_{OUT}$ has been modulated, the process 400 returns to block 404.

In some embodiments, process 400 can also include an operation that includes sending a voltage that represents heat-producing electronic device temperature, as read by the Peltier device, to a service processor. The service processor can then take action, including sending console alert, shutting down an electronic system, entering the temperature into a log, or alerting a user or administrator, if temperature is above a determined threshold.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A system for controlling, with a positive temperature-voltage correlation, an output of a voltage regulator circuit with a Peltier device, the system comprising: a heat-producing electronic device; the Peltier device that includes: a first surface arranged in thermally conductive contact with a surface of the heat-producing electronic device; a second surface opposing the first surface; and a set of semiconductor elements each in thermally conductive contact with the first surface and with the second surface, at least two of the semiconductor elements electrically coupled in series with a set of terminals, the set of terminals includes a positive terminal and a negative terminal, wherein the Peltier device is configured to raise an output voltage of the voltage regulator circuit to compensate for system performance degradation resulting from a high operating temperature of the heat-producing electronic device; and the voltage regulator circuit that includes: a driver device having an input terminal electrically coupled to an input voltage and an output terminal electrically coupled to a first terminal of the set of terminals; and a differential amplifier having: a non-inverting input electrically coupled to a reference voltage; an inverting input electrically coupled to the positive terminal of the set of terminals; and an output electrically coupled to a control input terminal of the driver device, wherein: the differential amplifier is configured to, in response to a voltage produced by the Peltier device, modulate the output voltage on the output terminal of the driver device, with the positive temperature-voltage correlation, by varying a voltage on the control input terminal of the driver device.

2. The system of claim 1, wherein the differential amplifier is an operational amplifier.

3. The system of claim 1, wherein the driver device is selected from the group consisting of: an NPN transistor, a PNP transistor, an N-channel field-effect transistor (NFET), and a P-channel field-effect transistor (PFET).

4. The system of claim 1, wherein the output voltage on the output terminal of the driver device is electrically coupled to a supply voltage input of the heat-producing electronic device.

5. The system of claim 1, wherein the output voltage on the output terminal of the driver device is electrically coupled to a supply voltage domain of the heat-producing electronic device, wherein the supply voltage domain is selected from the group consisting of: a clock voltage domain, an input/output (I/O) voltage domain, an analog voltage domain and a digital logic voltage domain.

6. The system of claim 1, wherein the heat-producing electronic device is selected from the group consisting of: a processor integrated circuit (IC), an analog IC, a mixed-signal IC and an IC containing digital logic circuits.

7. The system of claim 1, further comprising a heat sink in thermally conductive contact with the second surface of the Peltier device.

8. The system of claim 1, further comprising at least one resistor electrically coupled in series with a terminal of the set of terminals.

9. A system for controlling, with a negative temperature-voltage correlation, an output of a voltage regulator circuit with a Peltier device, the system comprising: a heat-producing electronic device; the Peltier device that includes: a first surface arranged in thermally conductive contact with a surface of the heat-producing electronic device; a second surface opposing the first surface; and a set of semiconductor elements each in thermally conductive contact with the first surface and with the second surface, at least two of the semiconductor elements electrically coupled in series with a set of terminals, the set of terminals includes a positive terminal and a negative terminal, wherein the Peltier device is configured to reduce an output voltage of the voltage regulator circuit to compensate for system performance degradation resulting from a high operating temperature of the heat-producing electronic device; and the voltage regulator circuit that includes; a differential amplifier having: an inverting input electrically coupled to a reference voltage; a non-inverting input electrically coupled to the positive terminal of the set of terminals; and an output electrically coupled to a control input terminal of a driver device, wherein: the differential amplifier is configured to, in response to a voltage produced by the Peltier device, modulate the output voltage on an output terminal of the driver device, with the negative temperature-voltage correlation, by varying a voltage on the control input terminal of the driver device.

10. The system of claim 9, wherein the differential amplifier is an operational amplifier.

11. The system of claim 9, wherein the driver device is selected from the group consisting of: an NPN transistor, a PNP transistor, an N-channel field-effect transistor (NFET), and a P-channel field-effect transistor (PFET).

12. The system of claim 9, wherein the output voltage on the output terminal of the driver device is electrically coupled to a supply voltage input of the heat-producing electronic device.

13. The system of claim 9, wherein the output voltage on the output terminal of the driver device is electrically coupled to a supply voltage domain of the heat-producing electronic device, wherein the supply voltage domain is selected from the group consisting of: a clock voltage domain, an input/output (I/O) voltage domain, an analog voltage domain and a digital logic voltage domain.

14. The system of claim 9, wherein the heat-producing electronic device is selected from the group consisting of: a processor integrated circuit (IC), an analog IC, a mixed-signal IC and an IC containing digital logic circuits.

15. The system of claim 9, further comprising a heat sink in thermally conductive contact with the second surface of the Peltier device.

16. The system of claim 9, further comprising at least one capacitor electrically coupled in a configuration selected from the group consisting of: between an input terminal of the driver device and aground, between the output terminal of the driver device and a ground, and between the output terminal of the driver device and a first terminal of the set of terminals.

17. A method for modifying a voltage regulator output voltage solely in response to a changed amount of heat received by a Peltier device, the method comprising:
receiving, with the Peltier device, the changed amount of heat from a thermal source, wherein the Peltier device is configured to receive the changed amount of heat to compensate for system performance degradation resulting from a high operating temperature of a circuit powered by an output voltage of a driver device;
modifying, in response to the changed amount of heat, an output voltage of the Peltier device;
receiving, with a voltage regulator differential amplifier having an inverting input electrically coupled to a positive terminal of the Peltier device, the output voltage of the Peltier device;
modulating, with an output voltage of the voltage regulator differential amplifier electrically coupled to the driver device, a driver device control input voltage; and
modulating, with the driver device, in response to the driver device control input voltage, the output voltage of the driver device.

18. The method of claim 17, wherein the modulating of the output voltage of the driver device results in a performance change of a circuit powered by the output voltage of the driver device, the performance change selected from the group consisting of: a performance increase and a performance decrease.

19. The method of claim 17, wherein the thermal source is selected from the group consisting of: a heat-producing electronic device, an environmental chamber, freeze spray, an infrared heat source, and a heat gun.

20. The method of claim 17, wherein the output voltage of the driver device is modulated to have a positive temperature-voltage correlation with a temperature differential between a hot surface of the Peltier device and a cold surface of the Peltier device, the Peltier device in thermally conductive contact with a heat-producing electronic device.

* * * * *